United States Patent
Kukal et al.

(10) Patent No.: US 7,490,309 B1
(45) Date of Patent: Feb. 10, 2009

(54) METHOD AND SYSTEM FOR AUTOMATICALLY OPTIMIZING PHYSICAL IMPLEMENTATION OF AN ELECTRONIC CIRCUIT RESPONSIVE TO SIMULATION ANALYSIS

(75) Inventors: Taranjit Singh Kukal, Delhi (IN); Alok Tripathi, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 200 days.

(21) Appl. No.: 11/513,061

(22) Filed: Aug. 31, 2006

(51) Int. Cl.
*G06F 17/50* (2006.01)

(52) U.S. Cl. .............................. 716/10; 716/12; 716/13; 716/14; 716/15

(58) Field of Classification Search .................... 716/10, 716/12, 13, 14, 15
See application file for complete search history.

(56) References Cited

U.S. PATENT DOCUMENTS

| | | | |
|---|---|---|---|
| 6,496,962 B1 * | 12/2002 | Dalton | 716/6 |
| 7,024,640 B2 * | 4/2006 | Buchanan | 716/4 |
| 2003/0212964 A1 * | 11/2003 | Rao et al. | 716/1 |
| 2005/0120319 A1 * | 6/2005 | van Ginneken | 716/6 |
| 2005/0268268 A1 * | 12/2005 | Wang et al. | 716/9 |

* cited by examiner

*Primary Examiner*—Jack Chiang
*Assistant Examiner*—Magid Y Dimyan
(74) *Attorney, Agent, or Firm*—Rosenberg, Klein & Lee

(57) ABSTRACT

A method and system are provided for optimizing physical implementation of an electronic circuit responsive to simulation analysis thereof. The method and system include schematically defining the electronic circuit to include a plurality of circuit elements interconnected at respective nodes by a plurality of nets, and acquiring parametric values for a plurality of predetermined operational parameters from simulated operation of the electronic circuit. The parametric values are automatically processed to generate a plurality of parametric constraints corresponding thereto for optimizing physical implementation of the electronic circuit. A circuit layout at least partially representing a physical implementation of the schematic definition is then generated. The circuit layout, which includes a plurality of devices interconnected by a plurality of tracks, is adaptively configured in accordance with the parametric constraints.

24 Claims, 14 Drawing Sheets

TEMPERATURE OF DEVICES – TRAN.SIM [NO DERATING]

| | COMPONENT | PARAMETER | TYPE | RATED VALUE | MEASURED VALUE | % MAX |
|---|---|---|---|---|---|---|
| ◆ | X1 | TJ | AVERAGE | 200 | 311.8041 | 156 |
| ▷ | R1 | TB | AVERAGE | 200 | 81.2972 | 41 |
| ▷ | R7 | TB | AVERAGE | 200 | 55.5653 | 28 |
| ▷ | X3 | TJ | AVERAGE | 200 | 50.7283 | 26 |
| ▷ | R6 | TB | AVERAGE | 200 | 37.4071 | 19 |
| ▷ | X2 | TJ | AVERAGE | 175 | 29.4261 | 17 |
| ▷ | R3 | TB | AVERAGE | 200 | 29.2615 | 15 |
| ▷ | R9 | TB | AVERAGE | 200 | 28.9071 | 15 |
| ▷ | R2 | TB | AVERAGE | 200 | 27.0162 | 14 |

FIG.10

METHOD AND SYSTEM FOR AUTOMATICALLY OPTIMIZING PHYSICAL IMPLEMENTATION OF AN ELECTRONIC CIRCUIT RESPONSIVE TO SIMULATION ANALYSIS

BACKGROUND OF THE INVENTION

1. Field of the Invention

The subject method and system for automatically optimizing physical implementation of an electronic circuit is generally directed to the hardware implementation of a schematically defined electronic circuit. More specifically, the method and system automatically optimize certain aspects of the circuit's physical implementation based upon automatic analysis of its simulated operation.

To carry out such electronic circuit physical implementations as printed circuit boards (PCBs), the general design flow illustrated in FIG. 1 is typically followed. Once the desired electronic circuit is conceptually designed, it is schematically defined at the design entry stage 2. The schematic definition includes functional representations of electronic components and/or devices interconnected at various nodes by appropriate nets.

The functional integrity of this schematically defined circuit is then tested at the simulation stage 4. As the circuit has not been physically implemented at this stage, its electrical response is tested under simulated operational conditions, and the results analyzed by the user to assess the design's operability. The physical constraints that may be imposed by such factors as excessive voltage and current levels, power dissipation capacity, and potential electromagnetic interference (EMI) indicated by simulation remain to be addressed following this stage. Particularly in power electronics applications where voltage and current levels, their rates of change, power dissipation capacity of components, and potential EMI are sufficient in degree to significantly impact such implementation constraints as clearances between interconnection tracks, track widths, track lengths, and the placement of components. Reliability, safety, and adherence to performance standards will typically depend very much on the degree to which these constraints are optimized and observed, in light of the available resources.

Referring back to FIG. 1, the typical approach heretofore has been for the designer to manually intervene to analyze quantitative results obtained from the simulation in light of the prevailing implementation factors and formulate the appropriate constraints to be applied at the board placement & routing stage 6. The designer applies his/her expertise the simulation results to identify EMI critical nets, tracks requiring broader spacing, connections carrying high currents, components running at high temperatures, and the like. The designer then applies the appropriate board layout rules to the identified circuit portions and pertinent electrical quantities, manually imposing constraints upon the PCB routing that is to occur.

While automated tools may be utilized by the designer for one or more steps in this process, the overall approach remains quite manually coordinated and controlled, making the task of optimizing the constraints responsive extremely difficult. Indeed, even with the most skilled of designers and meticulous calculations, too many numeric iterations would be required to effectively optimize the implementation constraints in this manner. The calculations, in many cases, would yield at best approximations that fail to fully account for operational factors like the voltage and current conditions during operation over an entire time-point continuum.

The shear number of manual calculations and estimations alone would be overwhelming enough in many applications to keep the manually driven approach from being other than highly approximate in nature. For example, a circuit having a total of n nets would require n evaluations of currents and $n*(n-1)/2$ evaluations of estimated voltage differences across all net pairs. Comprehensive manual evaluation of the entire circuit very quickly becomes an unmanageable task, where the circuit even remotely approaches marginal levels of complexity.

Numerous undesirable consequences thus result from the highly manual approach to determining and applying appropriate implementation constraints, particularly in power electronic applications. Longer design cycles are brought about. Designers are forced to choose between accuracy and burdensome calculations, one at the expense of the other. Sub-optimal circuit implementations are made due to constraints based upon quantitative approximations such factors invariably conspire to raise manufacturing costs.

Perhaps even more significantly, much of the quantitative results made available by simulation remain largely unexploited in determining board layout. This is all the more problematic given that many simulation tools presently available, such as the SPICE simulation system, provide highly accurate modeling of a circuit's response during both transient and steady state operational periods. The growing levels of complexity in electronic circuit designs, in the meantime, invariably require increasingly tedious iterations to formulate implementation constraints at some appreciable degree of optimization. This makes it virtually impossible in many cases to adequately formulate constraints covering the entirety of the given circuit's implementation layout, much less over the full range of pertinent operational time periods, using the approaches heretofore employed.

2. Prior Art

Techniques for minimizing the computational burden in formulating layout constraints for PCB implementation of electronic circuits are known in the art. For example, spreadsheets containing correlations between trace widths and electric current values have been employed by circuit designers to aid them in setting particular trace widths for a circuit layout. Spreadsheets containing correlations between certain track clearance measures with particular voltage values have similarly been employed by circuit designers. Still, there is no method or system heretofore known which formulates and applies a set of implementation constraints comprehensibly optimized for substantially the entire circuit, over substantially the full range of its pertinent operational time periods. There is a need, moreover, for such a method and system which automatically formulates and applies the optimized implementation constraints automatically based upon voltages, currents, and/or other such actual measurements obtained from simulated operation of the circuit.

SUMMARY OF THE INVENTION

It is a primary object of the present invention to provide a method and system which automatically optimizes certain aspects of an electronic circuit's physical implementation.

It another object of the present invention to provide a method and system which applies quantitative results acquired from an electronic circuit's simulated operation to generate constraints for guiding its physical implementation.

It yet another object of the present invention to provide a method and system which adaptively updates an electronic circuit's physical layout in accordance with constraints derived from the results of simulated operation, and graphically represents certain of those constraints with respect to the physical layout.

These and other objects are attained by a method and system for optimizing physical implementation of an electronic circuit responsive to simulation analysis thereof provided in accordance with the present invention. The method and system include schematically defining the electronic circuit to include a plurality of circuit elements interconnected at respective nodes by a plurality of nets, and acquiring parametric values for a plurality of predetermined operational parameters from simulated operation of the electronic circuit. The parametric values are automatically processed to generate a plurality of parametric constraints corresponding thereto for optimizing physical implementation of the electronic circuit. The processing selectively translates the parametric values to parametric constraints in accordance with at least one predefined mapping rule. A circuit layout at least partially representing a physical implementation of the schematic definition is then generated. The circuit layout, which includes a plurality of devices interconnected by a plurality of tracks, is adaptively configured in accordance with the parametric constraints.

BRIEF DESCRIPTION OF THE DRAWINGS

FIG. 10 is an illustrative graphic representation in tabulated chart form of certain temperature-related parameters for a plurality of exemplary devices in accordance with one embodiment of the present invention;

DETAILED DESCRIPTION OF THE PREFERRED EMBODIMENTS

Figure 1:
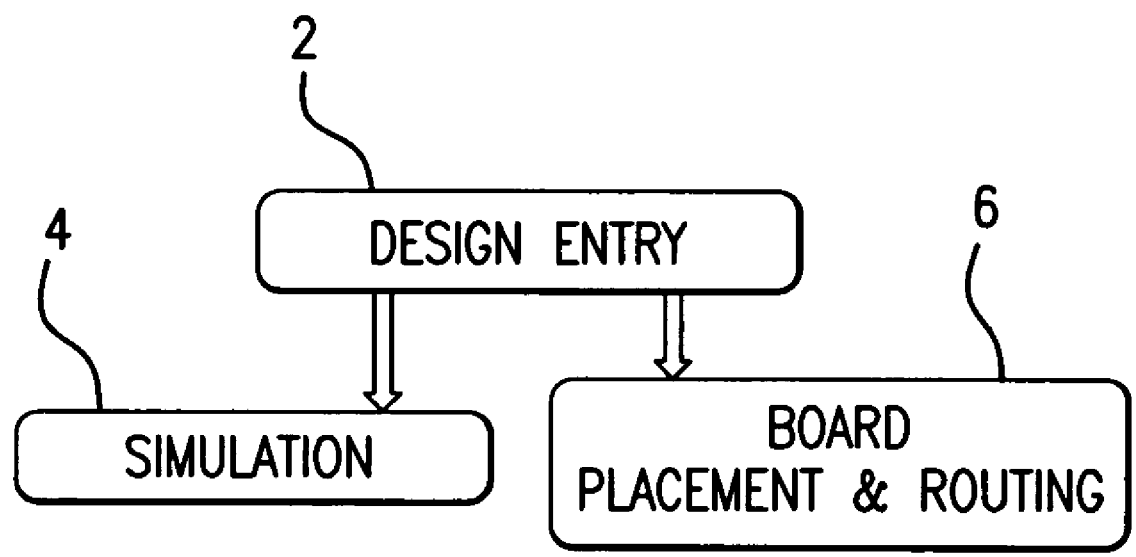
FIG. 1 is a schematic diagram illustrating a known circuit board design flow.
Figure 2:
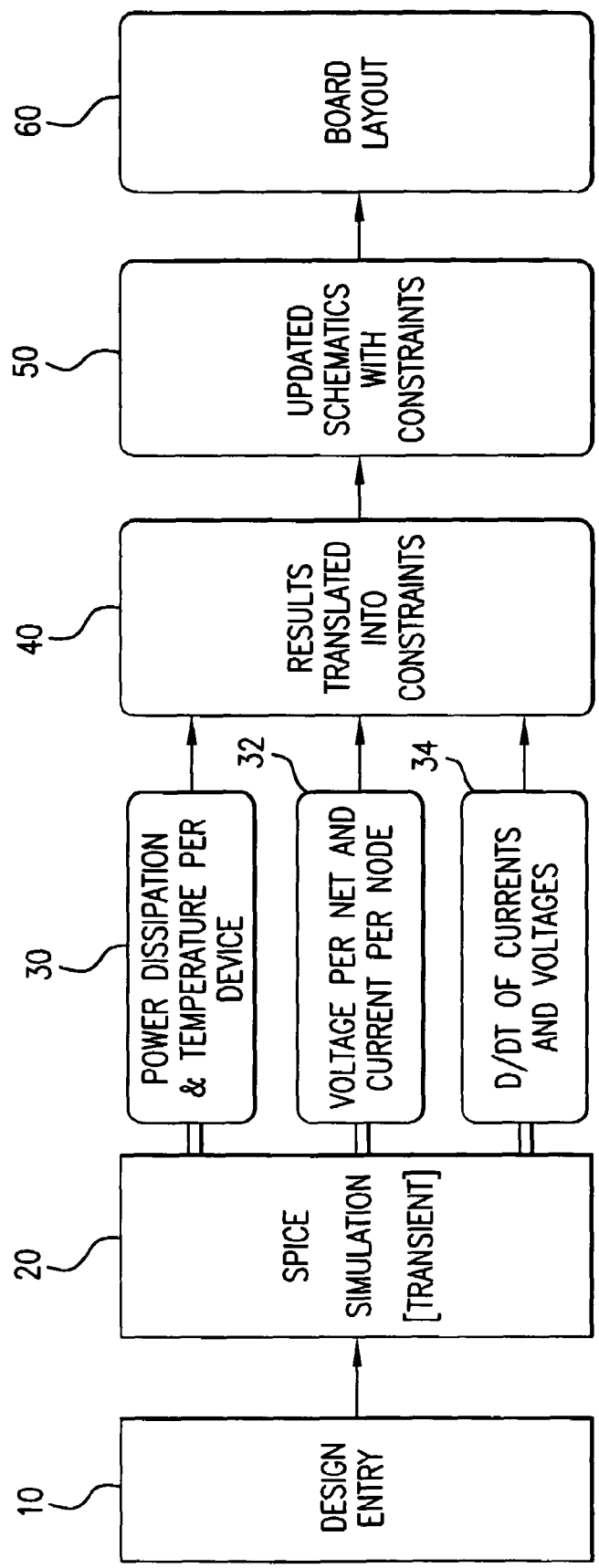
FIG. 2 is a schematic diagram illustrating a circuit board design flow in accordance with one embodiment of the present invention.

Referring now to FIG. 2, there is shown a schematic diagram illustrating the design and implementation flow in an exemplary embodiment of the present invention. Briefly, the overall operation of the present method and system illustrated is as follows:

Once the given circuit is schematically defined at the logic design level, with a plurality of circuit elements interconnected at respective nodes by a plurality of nets, the circuit's operation is simulated using SPICE, PSPICE, or other such suitable means known in the art. Quantitative measures such as node currents, net voltages, and the rates of their change obtained from simulation (either obtained directly therefrom or by observation of its results). Quantitative values for operational parameters obtained from simulation are comprehensively post processed to formulate a predetermined set of parametric constraints for optimizing the circuit's eventual physical implementation, preferably in the form of a PCB in the embodiment illustrated. These parametric constraints are then applied to the circuit's schematic definition to generate a graphic representation of the its physically implemented form, namely its corresponding board layout in the present embodiment.

In accordance with one aspect of the present invention, a plurality of graphic properties are adaptively applied to the circuit layout responsive to parametric constraints. The circuit layout preferably includes a plurality of electronic devices (which may include discrete components integrated circuits, or the like) interconnected by a plurality of tracks. The graphic properties adaptively applied to one or more of the devices and tracks in the layout include various colors for appropriate color coding and suitably coordinated track widths, lengths, and spacings.

The graphic properties are preferably displayed for the user when the circuit layout is graphically rendered for review. The graphic properties are determined in light of the track routing schedule and other such factors pertaining to the particular layout in the intended application.

Preferably, the post processing incorporates a set of mapping rules to map/translate the received and/or observed results of simulated operation to the required layout constraints where necessary, the layout constraints are determined based upon a suitable compilation of certain simulation results over pertinent time periods comparative identifications are preferably made by the post processing of such things as net pairs exhibiting excessive differences in voltage, nets subject to potentially critical levels of EMI, and devices potentially running at excessively 'hot' temperatures. The location, width, and length of particular segments in a routed track are automatically and optimally determined, and footprints are appropriately positioned and allocated for such devices as transformers, coils, filters, relays, and the like which may require particular thermal relief measures based upon the results of simulation.

Figure 4:
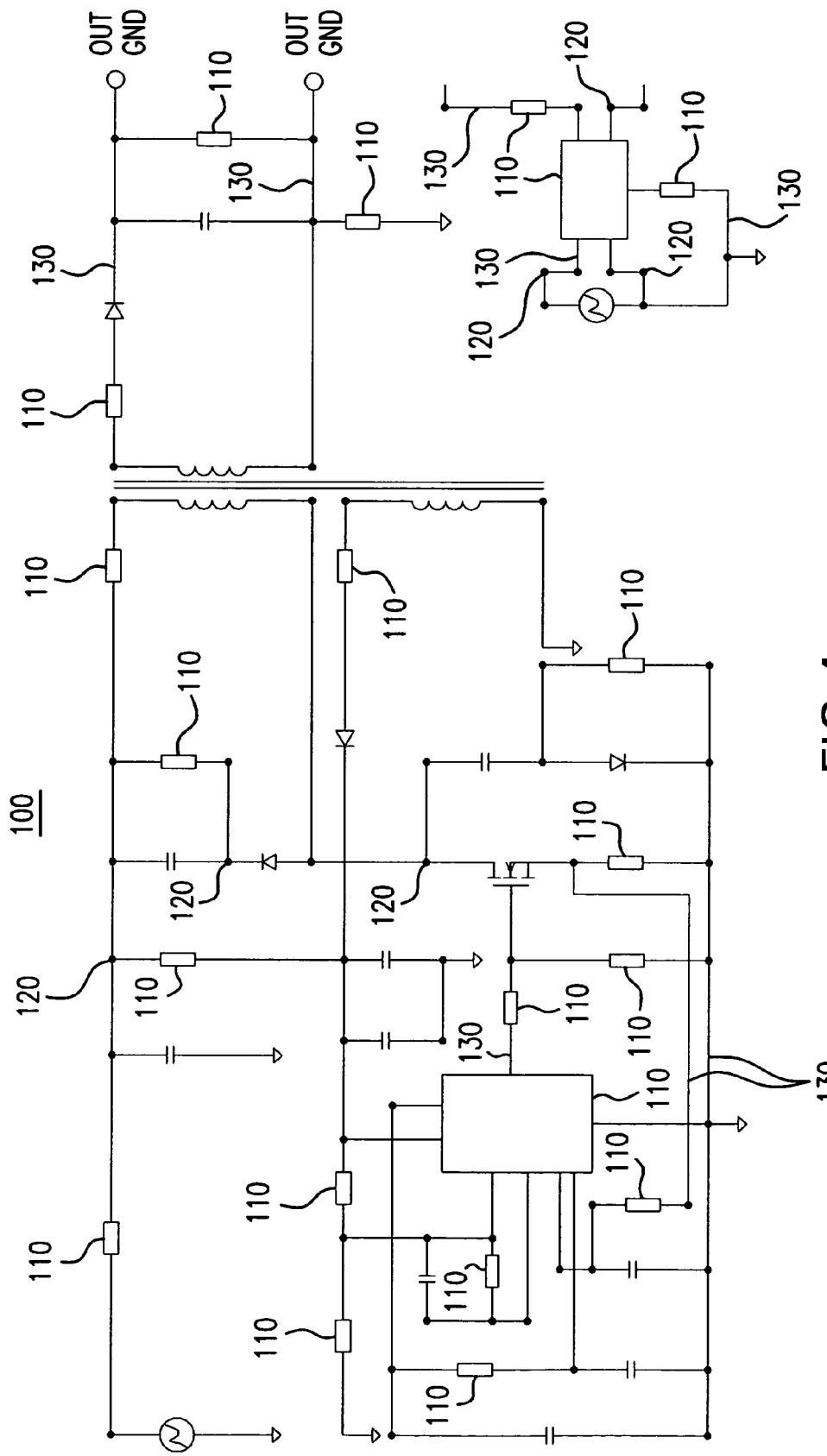
FIG. 4 is an illustrative example of a schematic definition for an electronic circuit to be physically implemented in accordance with the present invention.

Referring more specifically to the design and implementation flow illustrated in FIG. 2, the logic design of the given electronic circuit is schematically defined at the design entry state 10. An example of such schematically defined electronic circuit is illustrated in FIG. 4. As there shown, a plurality of electrical elements 110 of various type are symbolically represented. These circuit elements 110 are interconnected by a plurality of nets 120 through respective nodes 130.

For simplicity, the number of nodes in the logic level schematic representation of the electronic circuit is assumed equal to the number of nodes in the corresponding circuit layout. This need not be the case in other embodiments where the routing topology may subsequently provide a net schedule that does not preserve the same number of nodes (in the form of pins and terminals).

At the simulation stage 20, the schematically defined circuit's operation is simulated under expected operating conditions. Preferably, simulation is made to encompass both transient and steady state operation of the circuit so as to insure that worst case conditions are captured for the parameters of interest. Transient simulation is performed with test inputs and loads suitably replicating actual line and load conditions to be encountered in the intended application, and is so performed using any suitable means known in the art.

The pertinent results of the simulation are collectively acquired at stages 30, 32, 34. In the example shown, quantitative values are collected or derived for such parameters as the power dissipation and resultant heating of each device to be subsequently included in the circuit layout. Quantitative values are also collected or derived for such parameters as circuit branch voltages and currents at device terminals, as well as the time-based derivatives of the branch voltages and terminal currents.

The power dissipation value is calculated at stage 30 for each device of the circuit layout (which may include one or more of the schematically defined circuit elements). This power dissipation value is calculated from the simulation-measured voltages and currents pertaining to each device. The thermal response of the device during operation is then estimated based upon its characteristic thermal resistance value. Such values for the devices to be included in the circuit layout are subsequently used to identify 'hot' devices to enable judicious placement for optimum thermal performance in the resulting implementation.

At stage 32, the RMS/peak voltages measured at all the nets, over all time points of the given time period of simulated operation are acquired to identify those nets/pairs exhibiting the greatest differences in voltage during operation. Those net pairs exhibiting a voltage difference which exceeds a predetermined threshold level are accordingly identified for suitably extended spacing when layout routing is performed.

The steady state RMS currents measured during simulation at the pins making up each of the nets are also acquired at stage 32. Once the routing schedule is developed, these average RMS current values are taken in light of that routing schedule to derive appropriate widths for the track portions implementing the net on the circuit layout. The track widths are suitably set to accommodate measured level of current flow.

At stage 34, time-based derivative measurements are made preferably on all the voltage values and current values pertaining to each net. The resultant data serves to indicate the nets' degree of harmonic content during circuit operation. Those nets yielding the highest derivative measurement values are accordingly noted as potential EMI critical nets and therefore implemented preferably with the shortest path routing in the circuit layout.

The electrical parameter values collectively acquired at stages 30, 32, 34 are then further processed at stage 40 to obtain the appropriate physical implementation constraints corresponding thereto. The constraints which, depending on the particularities of the intended application, may be expressed as layout rules are obtained from such processing of simulation results. They include, for instance, the spacing between tracks, the widths of the tracks, and indications of devices expected to run unduly hot and track portions belonging to EMI critical nets. These parametric constraints serve to optimize the circuit layout. Each is more specifically described in following paragraphs.

Figure 3:
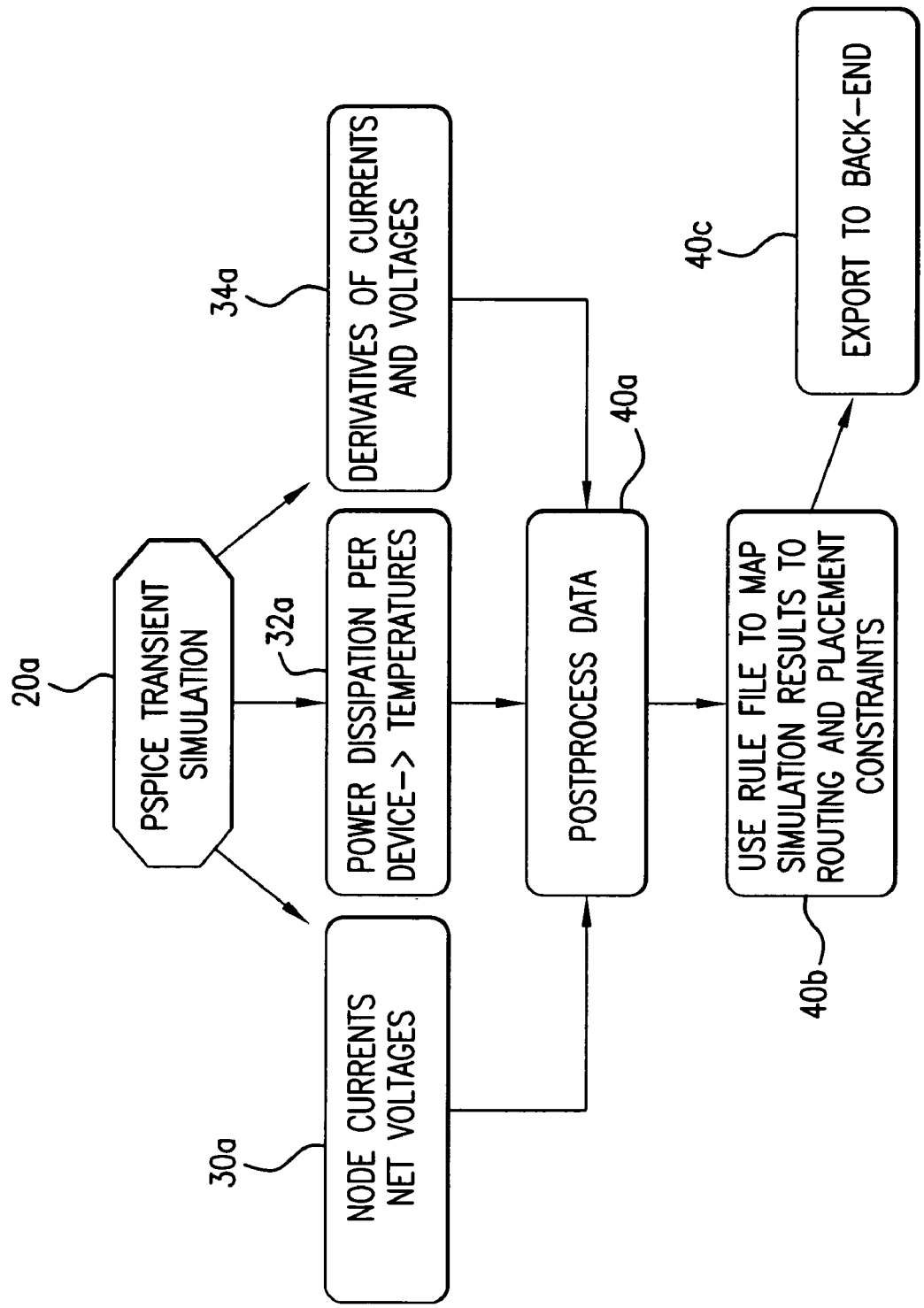
FIG. 3 is a schematic diagram illustrating greater detail a portion of the circuit board design flow illustrated in FIG. 2.

Referring to FIG. 3, the parametric values obtained from the simulation are preferably post processed at block 40*a* to generate the comprehensive electrical data from which to derive the optimizing physical implementation constraints. The electrical data is translated, or mapped, at block 40*b* to corresponding physical constraints in accordance with a plurality of programmably set mapping rules. The resulting constraints are then exported for appropriate subsequent use, as indicated at block 40*c*.

Track Spacing:

The relative spacing between neighboring tracks routed on the layout is set in proportional relation to the voltage differential between those neighboring tracks. Tracks whose associated RMS voltage differential peak is greater than a predetermined threshold level are disposed as far apart as the requirements of the intended application will reasonably permit. Ample spacing is required between such tracks of high voltage differential to guard suitably against spark-over, or arcing, therebetween. Insufficient spacing may permit spark-over when high voltage transients across the neighboring tracks are encountered.

Preferably, the maximum voltage difference (peak/RMS) is calculated for all circuit net pairs at the post processing block 40*a*. The tracks corresponding to the nets and excessively offset in voltage are accordingly identified for distal spacing when routed for the layout.

Figure 5:
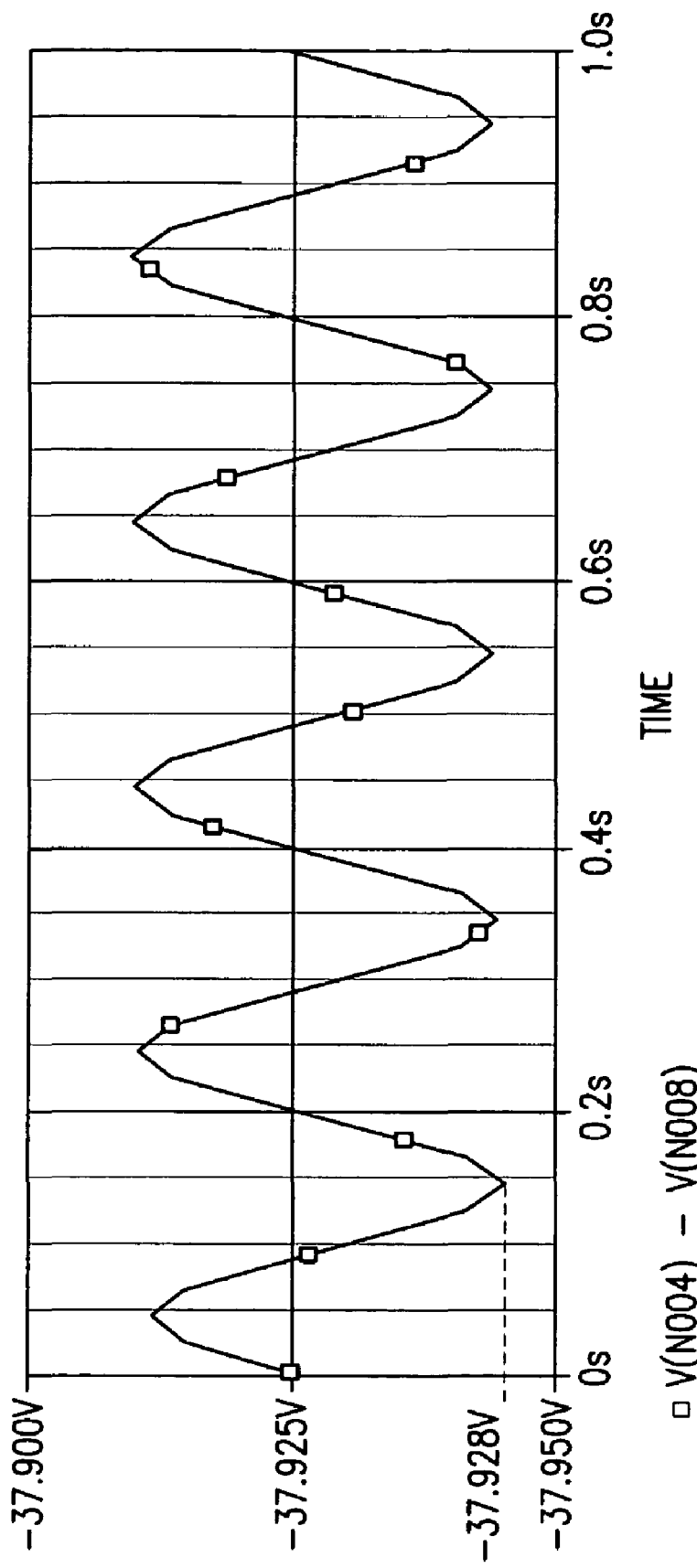
FIG. 5 is a graphic illustration of the difference in RMS/peak voltage for two exemplary nets are tracked over certain time points to determine their maximum RMS/peak voltage difference in accordance with one embodiment of the present invention.

In the exemplary embodiment illustrated, all combinations of the given circuit's net pairs are evaluated to determine the worst case voltage differentials between them, preferably over all relevant points in time during the simulated period of circuit operation. For each combination of net pairs, the differences in RMS/peak voltages for the two nets are tracked over the time points to determine their maximum RMS/peak voltage difference. This computation is graphically illustrated for one example (for net pairs N004 and N008) in FIG. 5. The minimum required spacing is suitably noted for this net pair if the voltage differential exceeds the predetermined threshold level.

Preferably, a plurality of predetermined threshold levels are employed to map observed voltage differentials between neighboring nets to the minimum spacing required between their corresponding tracks. A series of voltage ranges are defined, each indicating a different minimum track spacing requirement. An Example of a conversion-type table embodying this track spacing rule is shown in Table 1.

TABLE 1

Implementation Mapping Rule Example: Track Spacing

| Threshold/Range Number | Net Voltage Differential (V) | Minimum Track Spacing (Mils) |
|---|---|---|
| 1 | 100-199 | 150 |
| 2 | 200-299 | 200 |
| 3 | 300-399 | 300 |

The mapping rules between circuit net voltage difference and track spacing such as illustrated in Table 1 may be expressed in any suitable manner according to the particular requirements of the intended application. In certain applications, the mapping rules may reflect international or local standards governing physical space separation for various ranges of voltage differences observed between nets.

Track Width:

The required track width is determined based primarily upon the average RMS current carried by a track under worst case operating conditions which may include, for example, maximum temperatures and the least efficient performance characteristics. As a track may include numerous track segments each extending between a pair of connection points. Moreover, the connection pins may be of the type which sources current, or alternatively of the type which sinks current. When the routing topology is developed (using any suitable means known in the art) for the circuit layout, the current capacity of each track segment—that is the amount of current to be carried by that particular track segment—may be made available. Where such segment-by-segment current capacity is not available, the maximum required track width for any particular segment may be applied for the entire track.

In the embodiment illustrated, the width (or alternatively, thickness where more appropriate) is adaptively set for each track segment, depending upon the current capacity values obtained from the simulation for its constituent contacts/pins. Table 2 illustrates one example of the track width rules which may be applied to map the effective current capacity pertaining to a given track segment to the minimum width/thickness required.

TABLE 2

Implementation Mapping Rule Example: Track Segment Width

| Threshold/Range Number | Time-Averaged RMS Current Maximum (Amps) | Track Segment Width (Mils) |
|---|---|---|
| 1 | <1 | 8 |
| 2 | 1-10 | 20 |
| 3 | 11-20 | 30 |
| 4 | 21-30 | 40 |
| 5 | 31-40 | 50 |
| 6 | 41-50 | 60 |

As mentioned, some of the contacts/pins of the given track may serve effectively as drivers, or sources, from which current flows out, while others serve effectively as receivers, or sinks, into which the current flows. For each such node (contact/pin), a running average of the RMS current is acquired over the simulation time period. The current direction for a particular node is determined by the final value of the resulting waveform, and the amplitude of current taken to be the resulting waveform's maximum amplitude.

Figure 6:
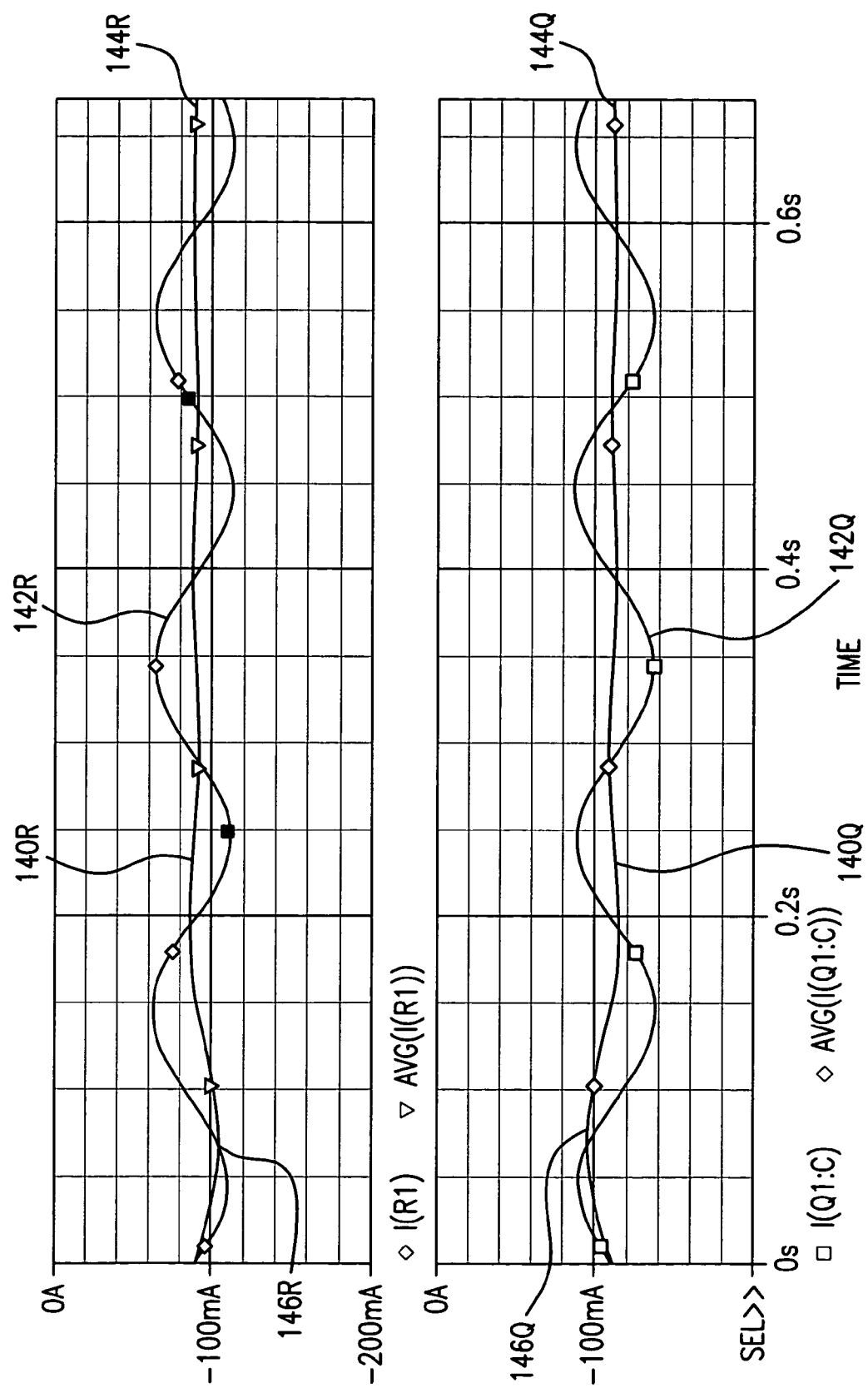
FIG. 6 is a set of graphic illustrations for RMS and running average RMS waveforms for exemplary node currents in accordance with one embodiment of the present invention.

FIG. 6 illustrates examples of such running average waveforms for RMS currents in a receiver (sink) node R1:1 and driver (source) node Q1:C. The running average waveforms 140R, 140Q for the nodes are shown plotted in time respectively with their corresponding RMS current waveforms 142R, 142Q.

The running average current waveforms 140R, 140Q effectively represents running averages of their respective node RMS currents accumulated over all of the time points preceding each given point in time. Each running average, waveform 140R, 140Q is evaluated to determine whether the corresponding node is to be modeled as a current driver, or as a current receiver, and to determine the maximum current amplitude attributable thereto. In the first instance, the polarity of the running average waveform's final value 144R, 144Q determines the node's current directions (driver or receiver) while in the second instance, the value at the waveform's maximum peak 146R, 146Q sets the node's current amplitude. Node R1 in this example may be modeled as a current receiver (negative amplitude at the final value 144R), with a current amplitude of 104.63669 mA (at maximum peak 146R); and, node Q1:C may be modeled as a driver (positive final value 144Q) with a current amplitude of 104.62762 mA (at maximum peak 146Q).

Figure 7:
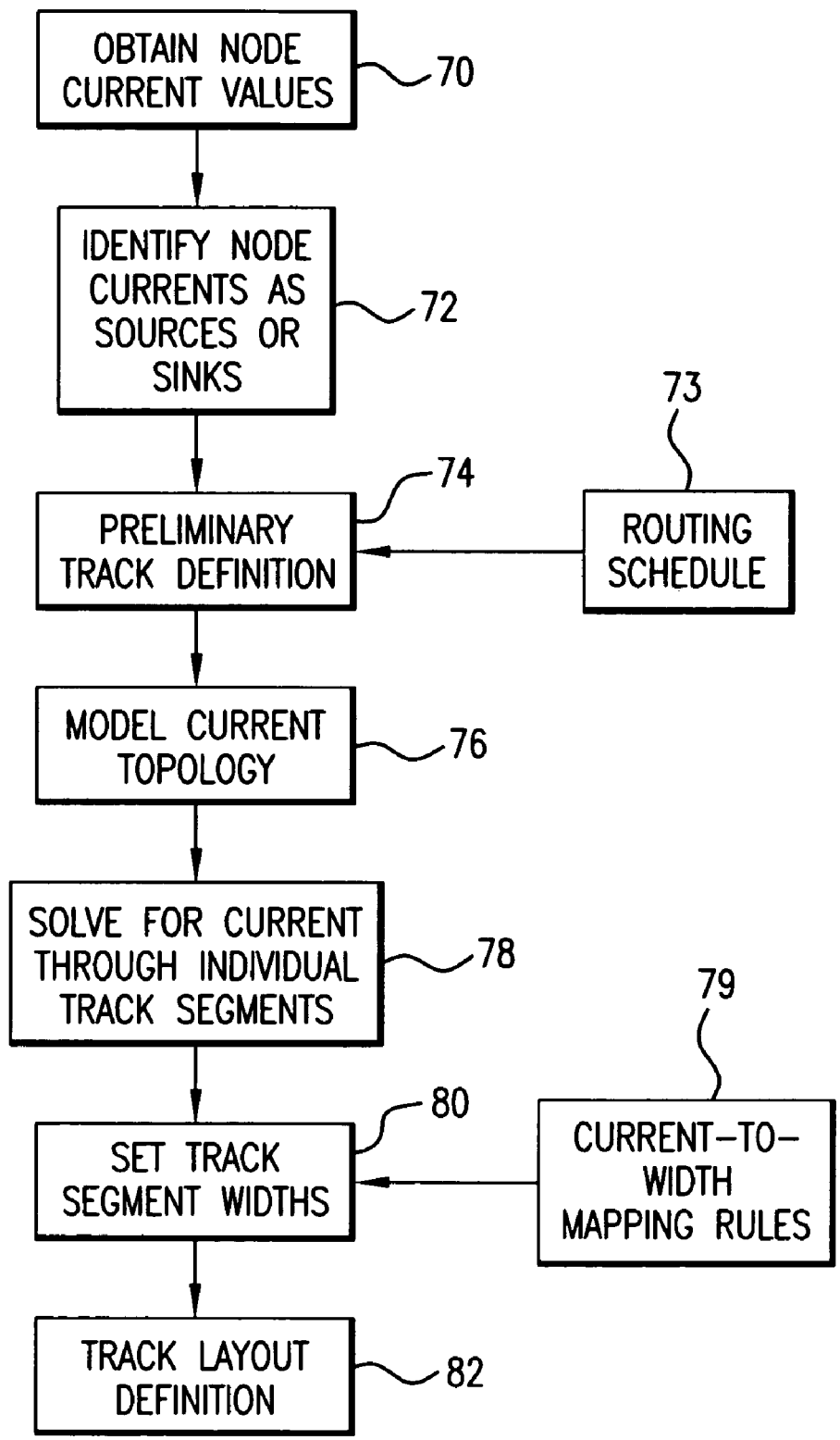
FIG. 7 is a flow diagram illustrating an exemplary process for generating a suitable track definition for a route schedule containing a plurality of nodes in accordance with one embodiment of the present invention.
Figure 8A:
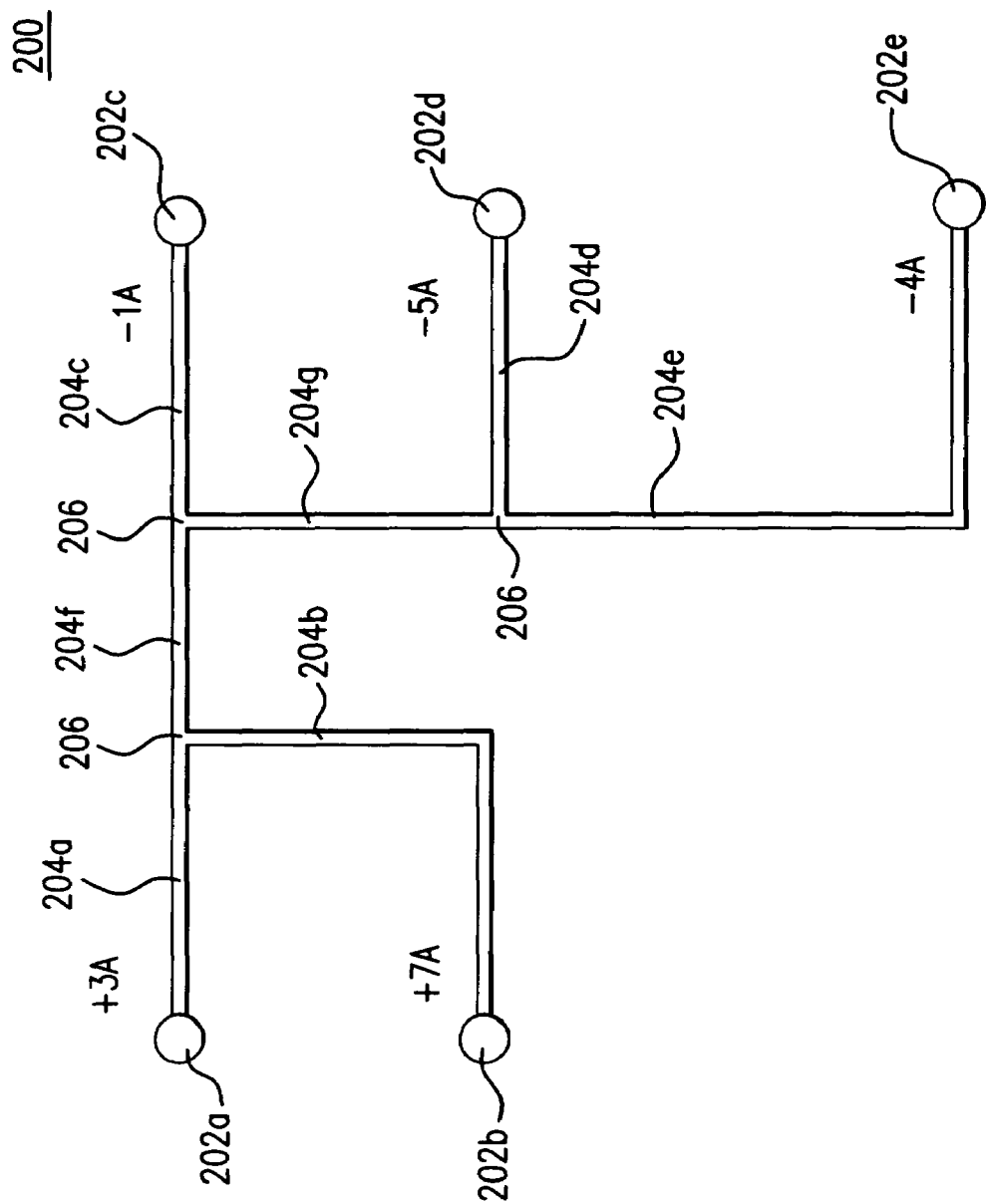
FIG. 8A is a schematic diagram illustrating a preliminary track definition formed for an exemplary route schedule in accordance with one embodiment of the present invention.
Figure 8B:
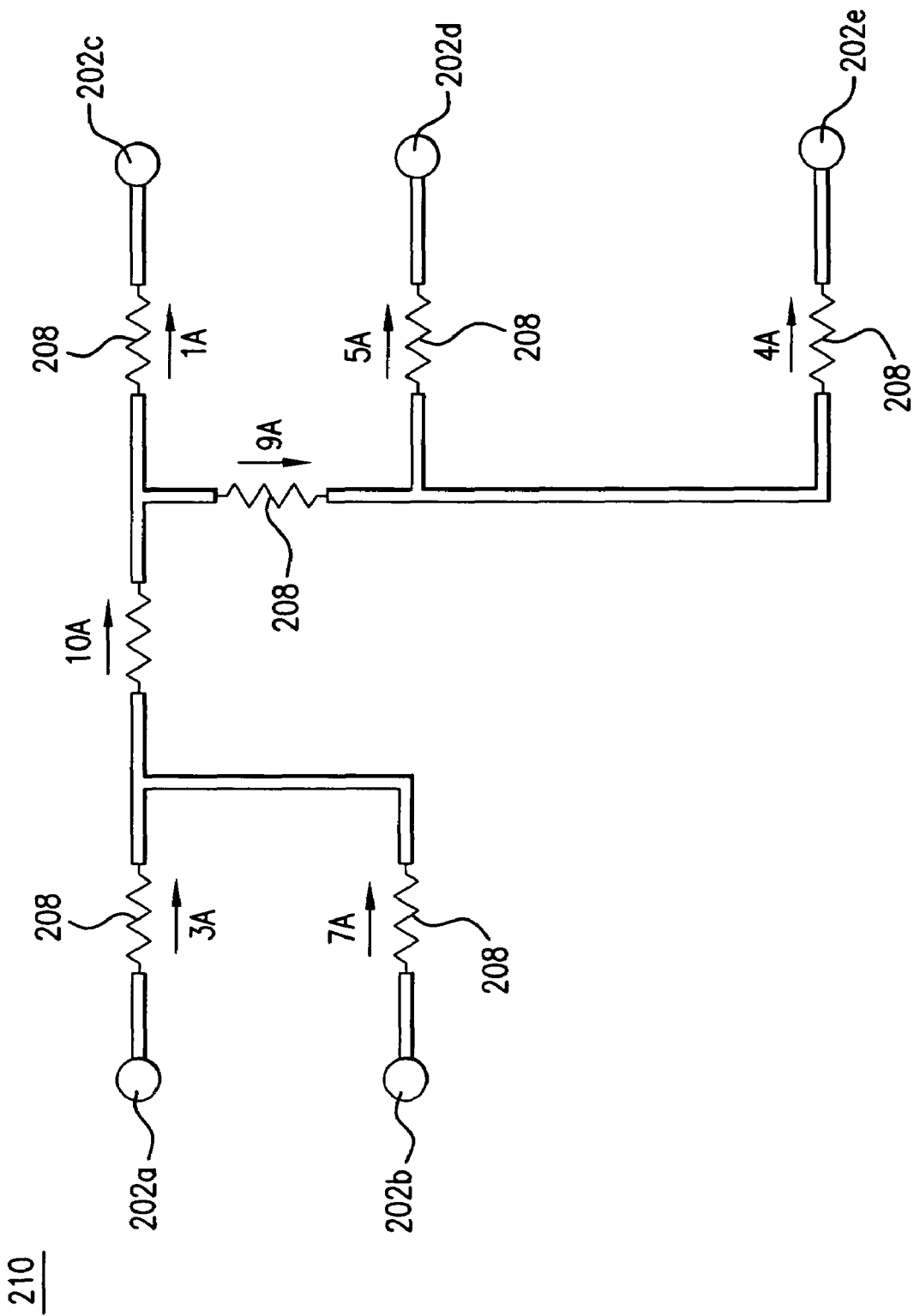
FIG. 8B is a schematic diagram illustrating an effective track definition modeled for the preliminary track definition of FIG. 8A in accordance with one embodiment of the present invention.

Referring now to FIG. 7, there is illustrated an exemplary process for generating a suitable track definition for a route schedule containing a plurality of nodes 202a-e (FIG. 8A). At blocks 70 and 72, the current information is obtained as described in preceding paragraphs for each node 202a-e, accordingly noting each as either a source or sink. This node current information is combined at block 74 with a simple routing schedule obtained at block 73 for the given track, to form a preliminary track definition 200 illustrated in FIG. 8A. A simple current topology is then extracted from the preliminary track definition at block 76 by preferably modeling the track segments 204a-g as equal-valued resistive elements 208, as illustrated in FIG. 8B. Each track segment 204a-g may be taken to be an uninterrupted portion of a track extending between a pair of nodes 202a-e, between a node 202a-e and a track branching point 206, or between a pair of such track branching points 206.

Figure 8C:
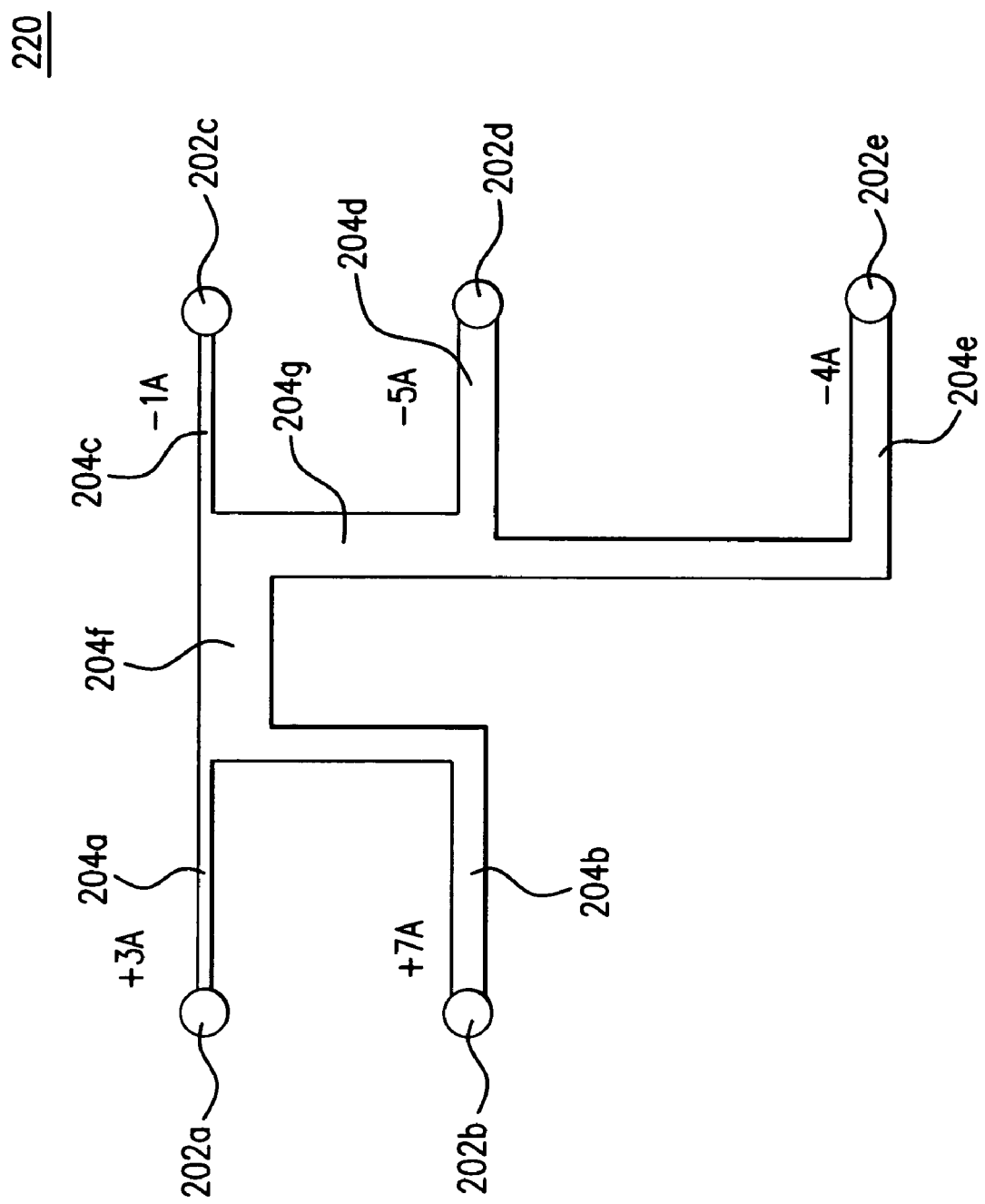
FIG. 8C is a schematic diagram illustrating a track layout definition formed for the effective track definition of FIG. 8B in accordance with one embodiment of the present invention.

The effective circuit 210 thus characterizing each track may then be 'solved' at block 78 to determine the magnitude and direction of current through each track segment 204a-g, as also illustrated in FIG. 8B. Referring then to the predefined mapping rules 79 for this particular example, appropriate track widths may be adaptively set at block 80 to form at block 82 the track layout definition 220, as illustrated in FIG. 8C. Because of its maximum current capacity in the example shown, the track segment 204f is accorded a greater width than any other in the track layout 220, while track segment 204c is accorded less width than any other given its minimal current capacity.

Identification of Hot Devices:

Where the circuit's simulation indicates that a device in the circuit will generate heat, the user is suitably alerted in that regard. Protective or avoidance measures may then be effected as needed. For example, a device flagged as a potentially hot-running device may accordingly be placed at that part of the circuit layout set to receive maximum ventilation and/or forced cooling flow. Such device may also be placed sufficiently away from other devices which might otherwise be detrimentally affected.

In accordance with one aspect of the present invention, hot devices are flagged as such preferably by suitable visual indicia. In the exemplary embodiment illustrated, the hot devices in question are marked according to a preset color coding scheme, whereby one or more predetermined thermal threshold levels define one or more distinctively colored degrees of 'hot' operation, as illustrated by the example in Table 3.

TABLE 3

Implementation Mapping Rule Example: Degrees of Hot-Running Devices

| Threshold/Range Number | Estimated Temperature (° C.) | Color |
|---|---|---|
| 1 | 50-70 | GREEN |
| 2 | 71-80 | BLUE |
| 3 | 81-100 | RED |

Estimates for device operating temperatures are computed during the post processing stage 30 from the power dissipation observed in the devices during simulation. The devices on the given circuit layout may be of various types, including discrete passive components, active switching devices, and active/passive integrated circuits. Depending on the device type, power dissipation may be obtained by one of several means. For instance, for passive discrete devices, the power dissipation is obtained simply by the measured voltage drop across the device multiplied by the current measured therethrough. For transistors and the like, the voltage-current product calculation may be integrated over a period of time. For active integrated circuits (such as a pulse wave modulator), the power dissipation may be obtained based upon the current sunk, as measured at the IC's source terminals. For passive IC's (such as a 3-terminal voltage regulator), the power dissipation may be obtained based upon the difference between the measured power into and the measured power delivered from such IC.

Once the power dissipation for the given device is suitably obtained, the rise in device temperature due to such power dissipation is preferably computed in accordance with a characteristic temperature coefficient, $R_{ja}$ predefined for the device. The rise in device temperature is then summed with the ambient temperature to arrive at the device's overall temperature, $T_{new}$, as follows:

$$T_{new} = R_{ja} * P_{dissip} + T_{amb}$$

Where $R_{ja} = R_{jc} + R_{ca}$, $R_{jc}$ representing a characteristic junction-to-case temperature coefficient of the device; and, $R_{ca}$ representing the characteristic case-to-ambient temperature coefficient of the device.

Figure 9:
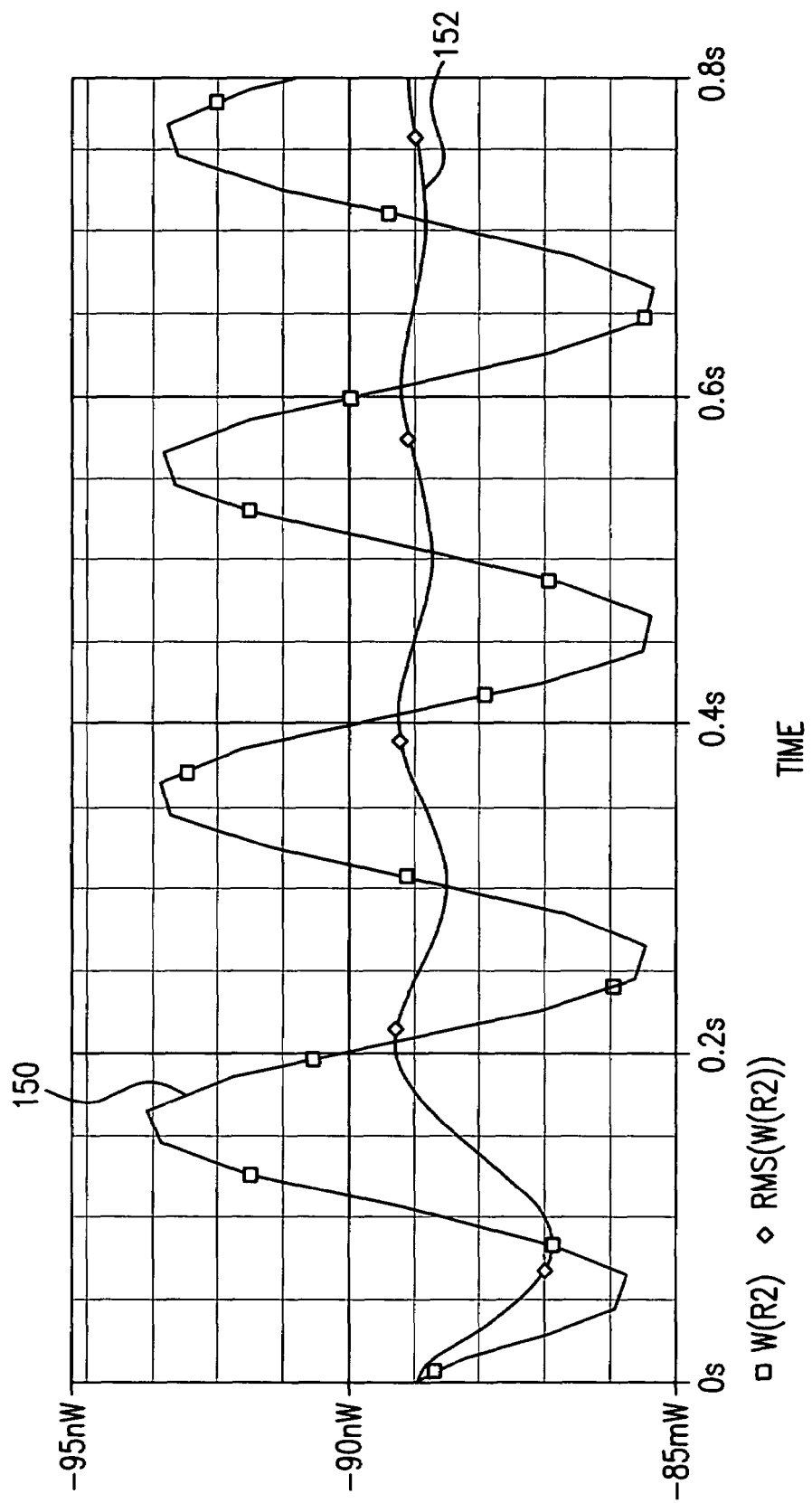
FIG. 9 is a graphic illustration of certain steady state power dissipation waveforms for an exemplary device R2 in accordance with one embodiment of the present invention.

Referring to FIG. 9, an example of a steady state power dissipation waveform is illustrated for an exemplary device, R2. Actually, the waveforms representing dissipative power, 150, as well as for the RMS of the dissipative power 152 are both shown. Preferably, the maximum RMS power dissipation level of the waveform is used in computing the device temperature.

The computed device temperatures are preferably compared against predefined threshold levels and accordingly categorized into appropriate temperature-based classes. A device's classification would serve to flag for a layout tool those devices expected to run at excessive temperatures and therefore requiring particular placement considerations.

The user may be visually alerted by graphic indicia denoting the devices' running temperature classifications. In the illustrated example of FIG. 10, an exemplary tabulation of the devices' X1, R1, R7, X3, R6, X2, R3, R9, R2 is shown for example, with corresponding parameter values, including the measured temperature value and temperature rating. Color-coded bars of a bar graph indicate the percentage of temperature rating represented by the measured value of temperature rise. The bar is colored red where the device's measured value of temperature rise exceeds its rating, and green where it does not. Similar color-coded indicia may be applied to the devices, for example, on a display or schematic of the circuit layout to be viewed by the user.

Identification of EMI Critical Nets:

In accordance with the present invention, the nets of the given circuit are preferably also categorized into different pre-defined classes depending on the rate of change in voltage and/or current thereat. Those experiencing the greatest rates of voltage and/or current change are flagged for appropriate routing measures, such as shortest path routing, avoidance of loops, and the like. Again, the nets and/or the tracks which physically implement them are preferably color-coded to visually indicate their classification in this regard.

Figure 11:
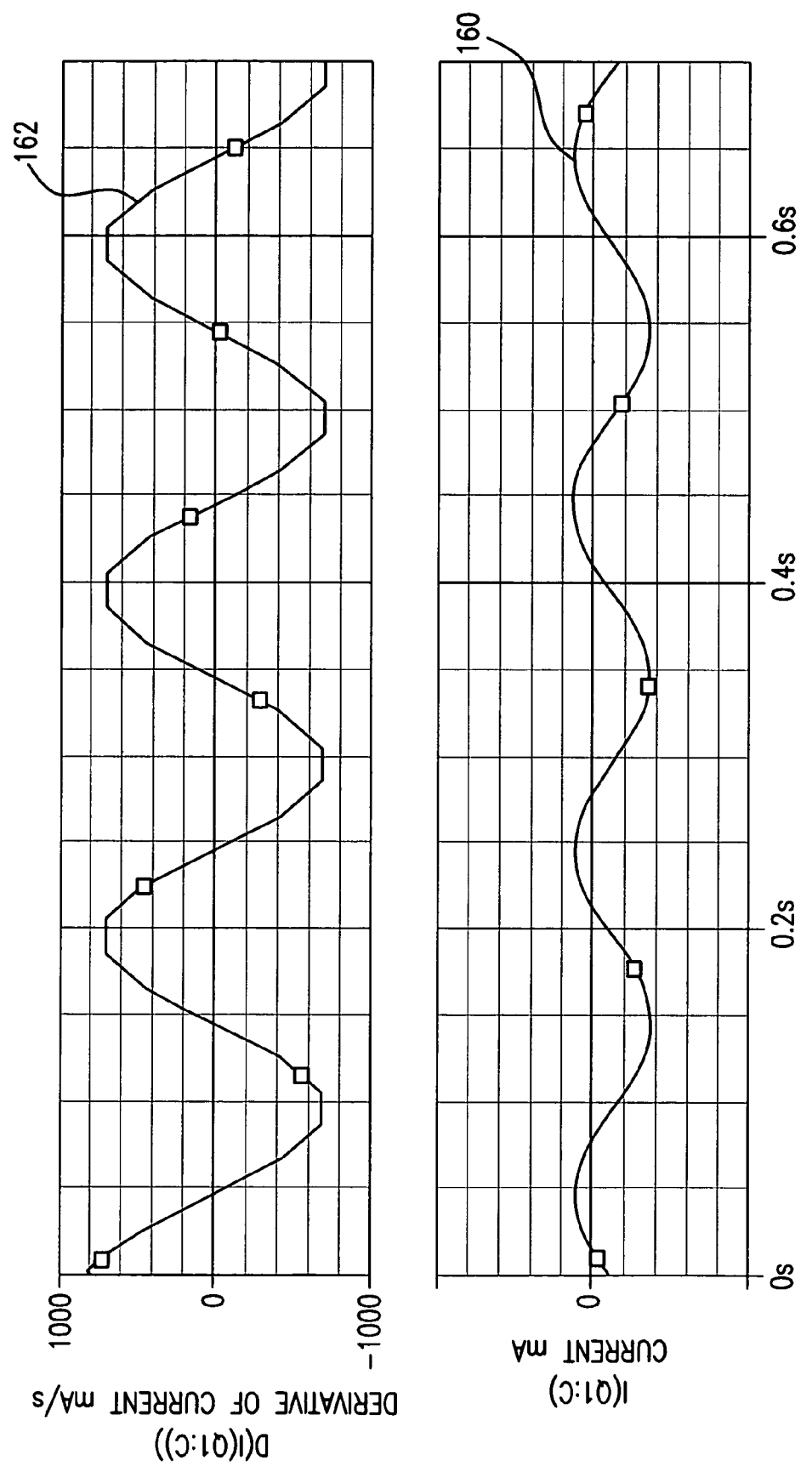
FIG. 11 is a set of graphic illustrations for changes in current and its time derivative obtained from simulation in accordance with one embodiment of the present invention; and, FIG. 12 is an illustrative example of a schematic definition for an electronic circuit layout updated with certain physical implementation constraints graphically rendered in accordance with one embodiment of the present invention.

As illustrated in FIG. 11, for the example of a current 160 and its time derivatives 162 respective waveforms for the changes in current and voltage, di/dt, dv/dt, may be obtained from simulation. The worst case di/dt and dv/dt values, or the maximum peak values from the corresponding waveforms are then obtained and categorized in accordance with a mapping scheme such as that illustrated in Table 4. Depending on which range of maximum di/dt and dv/dt the maximum rates of change observed at a particular net or track fall within, the appropriate color classification is preferably assigned to that net or track. Any rates of change exceeding a pre-defined threshold level is noted to be an EMI critical net/track, and appropriately flagged as such. In the example, this threshold rate of change is set at 2,000 Amps/microsecond and 2,000 volts/microsecond, with nets or tracks having rate values exceeding either of these thresholds being classified by the corresponding color (red in the example shown).

TABLE 3

Implementation Mapping Rule Example: Classification of Nets According to EMI Criticality

| Classification | DI/DT (Amp/µs) | DV/DT (V/µs) | Net/Track Color |
|---|---|---|---|
| 1 | 100-500 | | GREEN |
| 2 | 501-1000 | | BLUE |
| 3 | 1001-1500 | | VIOLET |
| 4 | 1501-2000 | | PINK |
| 5 (EMI Critical) | <2000 | | RED |
| 1 | | 100-500 | GREEN |
| 2 | | 501-1000 | BLUE |
| 3 | | 1001-1500 | VIOLET |
| 4 | | 1501-2000 | PINK |
| 5 (EMI Critical) | | <2000 | RED |

Since the worst case must be suitably accommodated, the classification applied to the net/track is chosen to be that associated with the more excessive of the rates (where they indicate different classifications).

Figure 12:
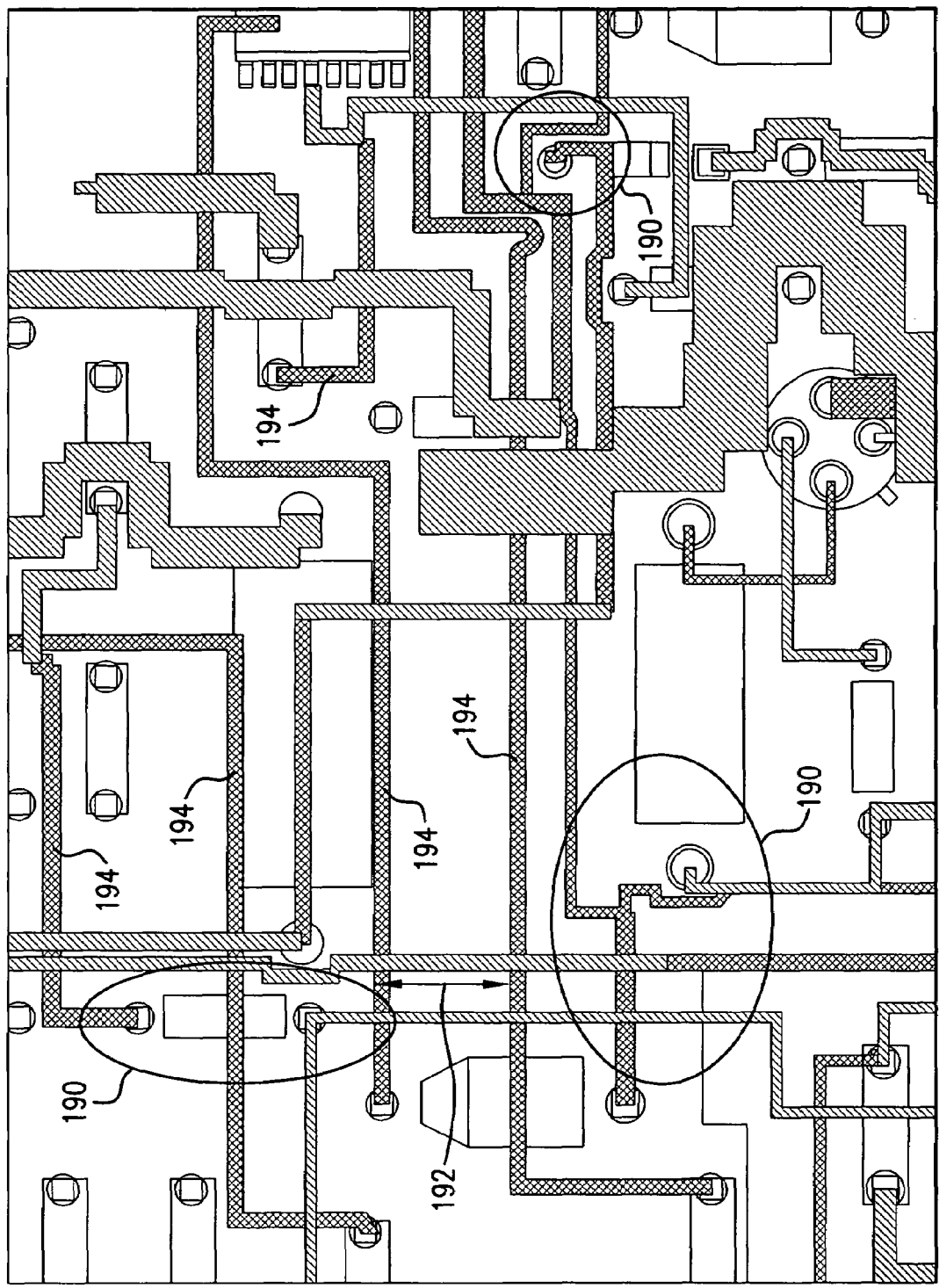

The physical implementation constraints formulated as described in proceeding paragraphs are used to update the schematic definition of the circuit in question. They are also passed to the given layout tool (which may be of any suitable type known in the art), so as to be reflected in the updated layout of the circuit. An example of such updated circuit layout (implemented as a PCB in this example), graphically rendered for the user's review is illustrated in FIG. 12. The applied constraints are reflected for example in the adaptively varied widths of track segment widths, such as indicated by the arrows 190, and spacing between segments of adjacent tracks, such as at the region 192. They are also reflected in the allocation of certain tracks for lengthier runs, with those tracks 194 determined to be EMI-critical noted in conspicuous manner to accordingly alert the user (for instance, a bright red color in the embodiment illustrated).

In accordance with yet another aspect of the present invention, the parametric values obtained and/or derived from simulation may also be processed for the dynamic creation of footprints in the circuit layout for devices having non-standard packaging. For example, devices such as transformers, coils, filters, relays, and the like are often acquired in non-standard, even custom, packages. In the implementation approaches heretofore known, a user typically creates footprints for these devices manually, depending on such considerations as the currents expected in the device's pads, during operation, and the voltages expected there across. In accordance with the present invention, however, device-specific parameters such as pad thicknesses, pad-to-pad spacing and their thermal relief may be derived as functions from the currents and voltages to which the device's pins are subjected during simulated operation.

In an illustrative embodiment, preliminary via and pad conventions at a particular pin of a device are set based on the steady state RMS current through the given pin. Where the RMS current exceeds a predefined limit, the peak current value is used to derive dimensional constraints much as in the manner described for the tracks of the circuit in preceding paragraphs. Similarly, the peak voltage difference across the device's terminals is used to derive minimum physical spacing requirements in much the same manner than minimum spacing requirements are derived for nets as also described in preceding paragraphs. The required footprint for the device may be developed upon successive derivations of dimensional/spacing constraints in this manner.

The various processing features and/or operations disclosed herein may be implemented in, or otherwise controlled by, any suitable computer executable form known in the art, and accordingly stored in suitable computer readable media. The specific details of such implementation or control will depend on the particular requirements of the intended application.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of circuit design and implementation flows or processing steps may be reversed or interposed, all without departing from the spirit or scope of the invention as defined in the appended claims.

What is claimed is:

1. A method of optimizing physical implementation of an electronic circuit responsive to simulation analysis thereof, comprising:
   a. schematically defining the electronic circuit to include a plurality of circuit elements interconnected at respective nodes by a plurality of nets;
   b. acquiring parametric values for a plurality of predetermined operational parameters from simulated operation of the electronic circuit;
   c. automatically processing said parametric values to generate a plurality of parametric constraints corresponding thereto for optimizing physical implementation of the electronic circuit, said processing selectively translating said parametric values to said parametric constraints in accordance with at least one predefined mapping rule; and,
   d. generating a circuit layout at least partially representing a physical implementation of said schematic definition, said circuit layout including a plurality of devices interconnected by a plurality of tracks, said circuit layout being adaptively configured in accordance with said parametric constraints.

2. The method as recited in claim 1, wherein said predetermined operational parameters include node current, net voltage, and rates of change thereof.

3. The method as recited in claim 2, wherein said parametric constraints include device temperature, track spacing, track width, and track harmonic content.

4. The method as recited in claim 3, wherein said processing includes deriving a device power dissipation value based upon said parametric values for said node current and net voltage, said device temperature being estimated for each said device based upon said device power dissipation value thereof.

5. The method as recited in claim 4 further comprising generating a plurality of graphic properties adaptively indicative of at least a portion of said parametric constraints, wherein said graphic properties include a plurality of alternative device colors selectively applied to at least one of said devices of said circuit layout responsive to said device temperature thereof.

6. The method as recited in claim 3, wherein said tracks having a track harmonic content exceeding a predefined harmonic threshold are selectively categorized as an electromagnetic interference (EMI) critical track, each said EMI critical track being flagged for shortened track length routing on said circuit layout.

7. The method as recited in claim 6, wherein said track harmonic content is determined based at least in part upon time-based derivatives of said node current and net voltages corresponding thereto.

8. The method as recited in claim 6 further comprising generating a plurality of graphic properties adaptively indicative of at least a portion of said parametric constraints, wherein said graphic properties include a plurality of alternative track colors selectively applied to at least one of said tracks of said circuit layout responsive to said track harmonic content thereof.

9. The method as recited in claim 3, wherein said processing includes comparing root mean squared (RMS) values for said net voltages of a plurality of said nets, and categorizing pairs of said nets different in said RMS net voltage values by more than a predefined voltage threshold as candidates for extended mutual spacing in said circuit layout.

10. The method as recited in claim 3, wherein said processing includes generating average RMS values for said node currents, and determining a track width for at least a portion of one said track corresponding thereto.

11. The method as recited in claim 10, wherein at least one said track is defined by at least first and second track segments, said processing determining for said first and second track segments track widths differing in value.

12. The method as recited in claim 1, further comprising rendering a display of said circuit layout having applied to said devices and tracks thereof a plurality of graphic properties adaptively indicative of at least a portion of said parametric constraints, said graphic properties including at least one of: a peripheral contouring of said tracks adaptively varied in width, a peripheral contouring of said tracks adaptively varied in length, a color-coded marking of said devices, and a color-coded marking of said tracks.

13. The method as recited in claim 1, wherein steps a-d are implemented in computer executable form stored in computer readable storage media.

14. A method of automatically optimizing physical implementation of an electronic circuit based upon simulated operation thereof, comprising:
   a. schematically defining the electronic circuit to include a plurality of circuit elements interconnected at respective nodes by a plurality of nets;
   b. postprocessing data acquired from simulated operation of the electronic circuit to generate parametric values for a plurality of predetermined operational parameters, said predetermined operational parameters including at least node current, net voltage, and rates of change thereof;

c. automatically mapping said parametric values in accordance with at least one predefined mapping rule to generate a plurality of corresponding parametric constraints for optimizing physical implementation of the electronic circuit, whereby said parametric values are translated to said parametric constraints, said parametric constraints including at least one of: device temperature, track spacing, track width, and track harmonic content;

d. generating a circuit layout at least partially representing a physical implementation of said schematic definition, said circuit layout including a plurality of devices interconnected by a plurality of tracks, said circuit layout being adaptively configured in accordance with said parametric constraints;

e. generating a plurality of graphic properties adaptively indicative of at least a portion of said parametric constraints, said graphic properties including a peripheral contouring of said tracks in a manner variable in width and length, a color-coded marking of said devices, and a color-coded marking of said tracks; and, f. displaying a graphic rendering of said circuit layout having said graphic properties applied to said devices and tracks thereof.

15. The method as recited in claim 14, wherein said postprocessing includes deriving a device power dissipation value based upon said parametric values for said node current and net voltage, said device temperature being estimated for each said device based upon said device power dissipation value thereof.

16. The method as recited in claim 14, wherein said track harmonic content is determined based at least in part upon time-based derivatives of said node current and net voltages corresponding thereto, said tracks greater in said track harmonic content than a predefined harmonic threshold being selectively categorized as an electromagnetic interference (EMI) critical track, and thereby flagged for shortened track length routing on said circuit layout.

17. The method as recited in claim 14, wherein said postprocessing includes comparing root mean squared (RMS) values for said net voltages of a plurality of said nets, and categorizing pairs of said nets different in said RMS net voltage values by more than a predefined voltage threshold as candidates for extended mutual spacing in said circuit layout.

18. The method as recited in claim 14, wherein at least one said track is defined by at least first and second track segments coupled respectively to first and second nodes, said postprocessing including generating average RMS values for said node currents at said first and second nodes, and responsively determining for said first and second track segments track widths differing in value.

19. The method as recited in claim 14, wherein steps a-e are implemented in computer executable form stored in computer readable storage media.

20. A system for automatically optimizing physical layout of an electronic circuit based upon simulated operation thereof, comprising:

a. a user interface unit operable to display a schematic definition of the electronic circuit including a plurality of circuit elements interconnected at respective nodes by a plurality of nets;

b. a postprocessing unit operable to acquire parametric values for a plurality of predetermined operational parameters from simulated operation of the electronic circuit;

c. a mapping unit coupled to said user interface and said postprocessing unit, said mapping unit being operable to selectively translate said parametric values in accordance with at least one predefined mapping rule to a plurality of parametric constraints corresponding thereto for optimizing a physical layout of the electronic circuit, said mapping unit being operable to generate a plurality of graphic properties adaptively indicative of at least a portion of said parametric constraints; and, d. a layout unit coupled to said mapping unit, said layout unit being operable responsive to said mapping unit to generate for graphic display on said user interface unit a circuit layout at least partially representing said physical layout of the electronic circuit corresponding to said schematic definition, said circuit layout including a plurality of devices interconnected by a plurality of tracks, said circuit layout being adaptively configured in accordance with said parametric constraints.

21. The system as recited in claim 20, wherein:

said predetermined operational parameters include at least node current, net voltage, and rates of change thereof, and said parametric constraints include at least one of: device temperature, track spacing, track width, and track harmonic content;

said postprocessing unit is operable to derive a device power dissipation value based upon said parametric values for said node current and net voltage; and, said mapping unit being operable to estimate device temperature for each said device based upon said device power dissipation value thereof.

22. The system as recited in claim 21, wherein said track harmonic content is determined based at least in part upon time-based derivatives of said node current and net voltages corresponding thereto, said tracks greater in said track harmonic content than a predefined harmonic threshold being selectively categorized as an electromagnetic interference (EMI) critical track, and thereby flagged for shortened track length routing on said circuit layout.

23. The system as recited in claim 22, wherein said postprocessing unit is operable to compare root mean squared (RMS) values for said net voltages of a plurality of said nets, and categorize pairs of said nets different in said RMS net voltage values by more than a predefined voltage threshold as candidates for extended mutual spacing in said circuit layout.

24. The system as recited in claim 23, wherein at least one said track is defined by at least first and second track segments coupled respectively to first and second nodes, said postprocessing unit generating average RMS values for said node currents at said first and second nodes, and responsively determining for said first and second track segments track widths differing in value.

* * * * *